United States Patent [19]
Clark, II

[11] Patent Number: 5,828,324
[45] Date of Patent: Oct. 27, 1998

[54] MATCH AND MATCH ADDRESS SIGNAL GENERATION IN A CONTENT ADDRESSABLE MEMORY ENCODER

[75] Inventor: Airell R. Clark, II, Albany, Oreg.

[73] Assignee: Hewlett-Packard Company, Palo Alto, Calif.

[21] Appl. No.: 664,902

[22] Filed: Jun. 17, 1996

[51] Int. Cl.$^6$ ................................................. H03M 7/30
[52] U.S. Cl. ............................................. 341/51; 341/106
[58] Field of Search ................................. 341/50, 51, 52, 341/55, 106, 94, 95, 87

[56] References Cited

U.S. PATENT DOCUMENTS

| | | | |
|---|---|---|---|
| 3,701,980 | 10/1972 | Mundy | 365/188 |
| 4,780,845 | 10/1988 | Threewitt | 365/49 |
| 4,881,075 | 11/1989 | Weng | 341/87 |
| 5,175,543 | 12/1992 | Lantz | 341/51 |
| 5,373,290 | 12/1994 | Lempel et al. | 341/51 |
| 5,455,576 | 10/1995 | Clark, II et al. | 341/50 |
| 5,555,397 | 9/1996 | Sasama et al. | 395/485 |

FOREIGN PATENT DOCUMENTS

| | | | |
|---|---|---|---|
| 0313190 | 8/1988 | European Pat. Off. | H03M 7/42 |
| 0380294 | 1/1990 | European Pat. Off. | G06F 7/02 |

OTHER PUBLICATIONS

"*Compression Of Individual Sequences Via Variable–Rate Coding*", By: Jacob Ziv, and Abraham Lempel, IEEE Transactions on Information Theory, vol. IT–24, No. 5, Sep. 1978.

"*Practical Dictionary Management For Hardware Data Compression*", By Ziv & Lampel, Development of a Theme, Department of Computer Science & Engineering FR–35 University of Washington Seattle WA 98195, pp. 33–50.

*Primary Examiner*—Todd DeBoer

[57] ABSTRACT

A method and apparatus for encoding MATCH signal and MATCH ADDRESS signal generation for a content addressable memory ("CAM") array is disclosed. Each CAM core has an output encoder for providing a MATCH signal and, if a MATCH is determined, a MATCH_ADDRESS signal indicative of the location in the CAM of the data of interest. In order to speed the critical search path, each signal line for the MATCH and MATCH_ADDRESS have the same number of transistors, with designated MATCH_ADDRESS transistors being used to indicate a MATCH, that is, providing a substitute MATCH signal, if the MATCH line has no transistor. The output encoder output signals are encoded to provide a final MATCH signal and a final MATCH_ADDRESS which adds a CAM core designator to the MATCH_ADDRESS from the CAM core having the data.

17 Claims, 7 Drawing Sheets

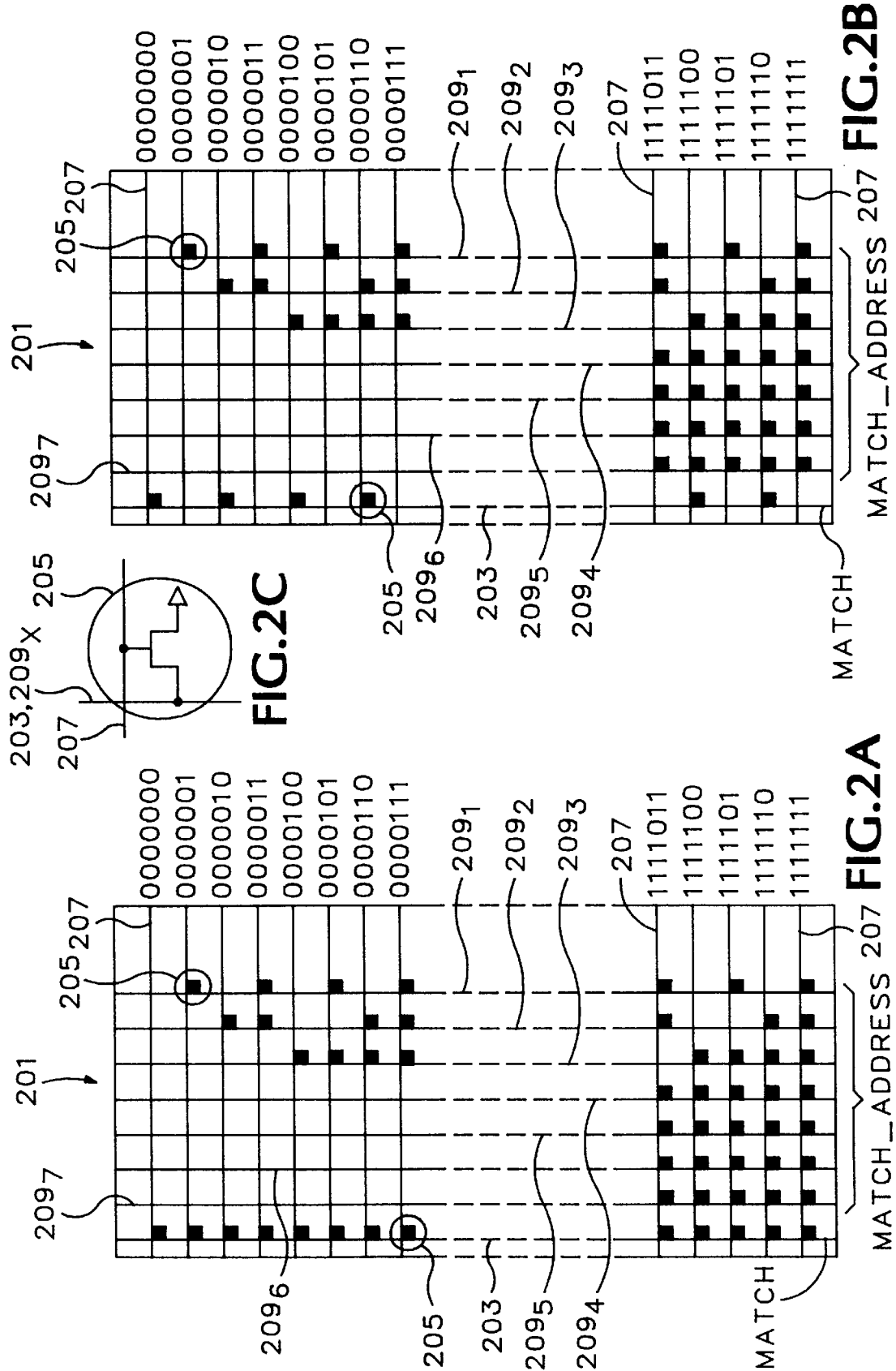

MATCH AND MATCH ADDRESS SIGNAL GENERATION IN A CONTENT ADDRESSABLE MEMORY ENCODER

BACKGROUND OF THE INVENTION

1. Field of the Invention

The present invention relates generally to the encoding of digital data and, more specifically, to MATCH and MATCH_ADDRESS signal generation in a content addressable memory encoder.

2. Description of Related Art

Random access memory ("RAM") is perhaps the most common form of integrated circuit memory available in the state of the art. However, RAM devices are not suited for use in systems which process associative data. For example, the well known methodology of sequentially accessing data when addressing the RAM is inefficient for systems involving stored information involving pattern recognition, natural language recognition, sparse matrix processes, and database interrogation. The address associated with the desired stored data may not be known. For this type of data, it is more efficient to interrogate a memory by supplying a compressed subset of the desired data or a code representative of the full data set. The memory responds by indicating either absence of the desired data set by a MISMATCH signal, or presence of the data set by a MATCH signal, and its associated address in the memory bank for the data set.

In the 1980's, another type of memory device was developed to have ambiguous and non-contiguous addressing and was dubbed the content addressable memory ("CAM"). See e.g., U.S. Pat. No. 3,701,980 (Mundy). In essence, for this type of associative data search, the entire CAM can be searched in a single clock cycle, giving it a great advantage over the sequential search technique required when using a RAM device.

A string dictionary can be stored in a CAM and used in generating Lev-Zempel compressed output data (hereinafter "LZ"; generically used for any LZ data compression technique; see "Compression of Individual Sequences Via Variable-Rate Coding", IEEE Transactions on Information Theory, 24(5):530–536, September 1978, incorporated herein by reference). The input data signal to the CAM would comprise a bit string representation of the data which is being searched for in the CAM. The output would be a signal indicative as to whether the data was found, the MATCH signal, and, if found, the location within the CAM, the MATCH_ADDRESS. Obtaining this MATCH and MATCH_ADDRESS information is done with what is called in the art a "match encoder." For example, for color hard copy printing, a data base may be stored in a CAM where the data consists of bit strings comprising tristimulus space values—cyan, yellow, magenta ("CYM").

The problem with CAM devices is that compared to RAM each individual cell structure is relatively complex. See e.g., U.S. Pat. No. 4,780,845 (Threewitt); incorporated herein by reference. Thus, for the same integrated circuit real estate, a CAM device can not match the density, speed, or low-power performance of a RAM device. Integrated circuit process improvements generally affect both types of devices equally, so that in relative terms, CAM architects can not do much to narrow the performance gap.

Perhaps the most critical path through the CAM is the search cycle; that is, the time from receipt of an input data signal, or code, to the encoder input to determine if the CAM has the desired data set to the time of the output of a match or mismatch indication, and, if a MATCH signal is generated, the MATCH_ADDRESS.

Therefore, there is a need to improve the speed of a search cycle, that is, to shorten the clock cycle duration, without the need of a integrated circuit fabrication process improvement.

SUMMARY OF THE INVENTION

In its basic aspects, the present invention provides an encoder apparatus for a CAM, having a cell array of addressable cell means for storage of data bits therein and appropriate CAM output circuitry for transmitting selected data. The apparatus includes: a first encoding mechanism for receiving the CAM cell array output, the first encoding mechanism further including a MATCH signal line connected to each cell, a plurality of MATCH ADDRESS signal lines connected to the MATCH signal line, and wherein the MATCH signal line and each of the MATCH ADDRESS signal lines have an identical number of substantially identical switching mechanism for indicating a change in digital state value on the MATCH signal and MATCH ADDRESS signal lines, respectively, wherein the MATCH signal line includes one of the switching mechanism for one-half of the cells in the cell array and wherein a predetermined one of the switching mechanism on the MATCH ADDRESS signal lines designates both a binary digit of the MATCH ADDRESS signal and a MATCH signal on lines for MATCH signals not having a MATCH signal line switching mechanism; and first output bus mechanism for transmitting MATCH signals and MATCH ADDRESS signals.

In another basic aspect of the invention there is presented a method for encoding MATCH signal and MATCH ADDRESS signal generation for a content addressable memory cell array. The method includes the steps of:

generating a single-bit MATCH signal for one-half of the data locations in the array;

generating a multi-bit MATCH ADDRESS signal for every data location in the array; and using a bit signal from a generated multi-bit MATCH ADDRESS signal as a substitute MATCH signal for every data location not generating a single-bit MATCH signal.

Embodiments of the apparatus and method are also explained for an implementation of an encoder apparatus for MATCH signal and MATCH ADDRESS signal generation for a bank of memory that includes a plurality of content addressable memory cores.

It is an advantage of the present invention that it improves the speed of a CAM search cycle without the need for integrated circuit fabrication process improvements.

It is an advantage of the present invention that it does not increase integrated circuit size or power requirements.

It is another advantage of the present invention that implementations can be designed to reduce integrated circuit size requirements.

It is still another advantage of the present invention that implementations can be designed to reduce power consumption.

Other objects, features and advantages of the present invention will become apparent upon consideration of the following explanation and the accompanying drawings, in which like reference designations represent like features throughout the drawings.

BRIEF DESCRIPTION OF THE DRAWINGS

FIGS. 2A, 2B, 2C are comparison schematic diagrams of detail for CAM core encoders as shown in FIG. 1 in which:

FIG. 2A represents a traditional encoder design, FIG. 2B represents a encoder in accordance with the present invention, and FIG. 2C shows a detail of FIGS. 2A and 2B.

FIGS. 3A and 3B and FIGS. 4A and 4B are comparison schematic diagrams of final_encoders as shown in FIG. 1 in which:

FIGS. 3A–3B represent a traditional final_encoder design, and

FIGS. 4A–4B represent a final_encoder in accordance with the present invention as shown in FIG. 1.

The drawings referred to in this specification should be understood as not being drawn to scale except if specifically noted.

DESCRIPTION OF THE PREFERRED EMBODIMENT

Reference is made now in detail to a specific embodiment of the present invention, which illustrates the best mode presently contemplated by the inventor for practicing the invention. Alternative embodiments are also briefly described as applicable. In order to assist the reader in understanding the best mode, a exemplary embodiment of a LZ compression system is provided. One implementation of such a system can be used in a commercial implementation for a color hard copy apparatus. There is no express intent to limit the applicability of the present invention to the exemplary embodiment nor should any such limitation be implied; the scope of the invention is defined by the claims set forth hereinafter.

Figure 1:
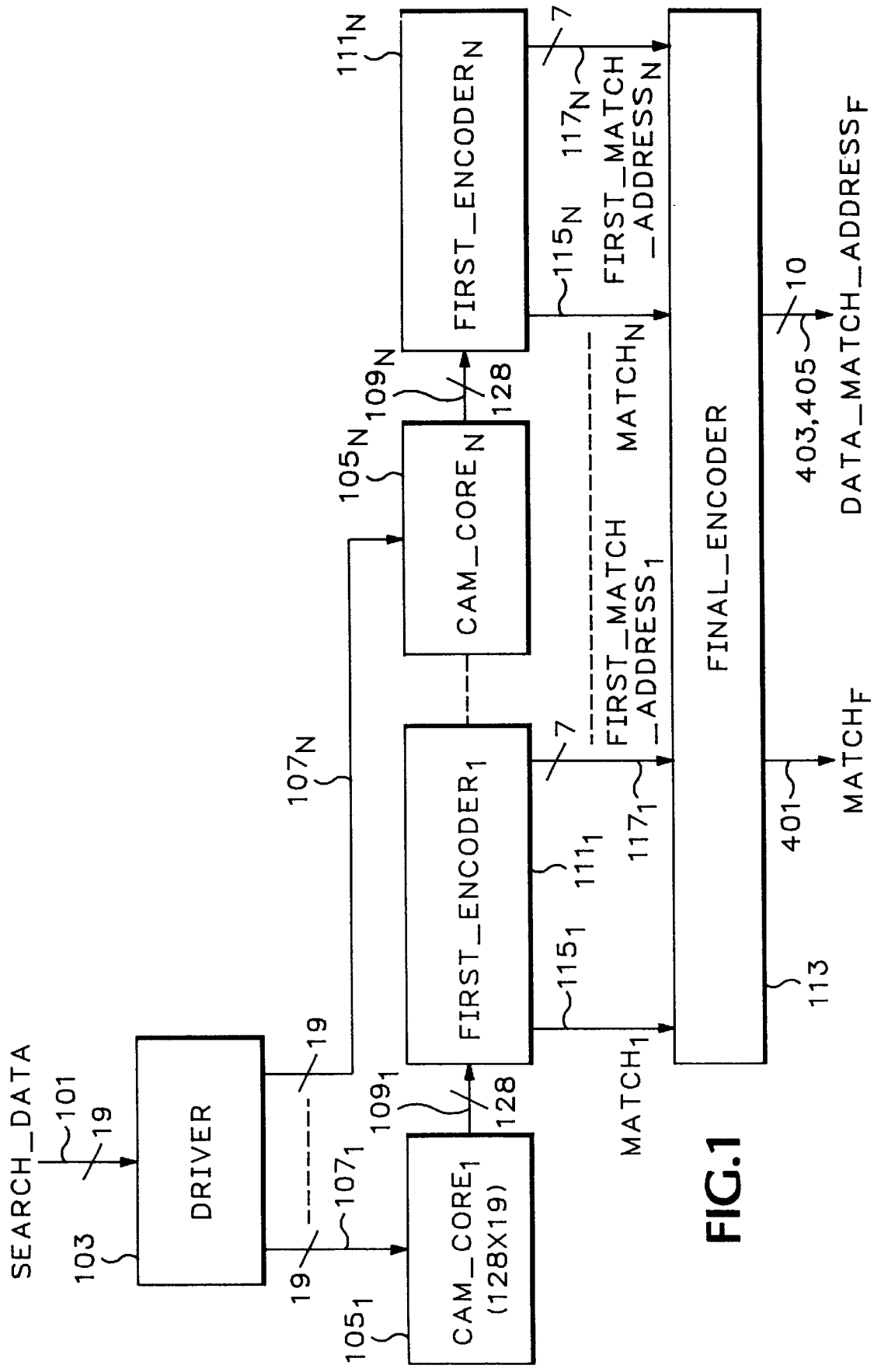
FIG. 1 is a schematic block diagram of a CAM system incorporating the present invention.
Figure 3A:
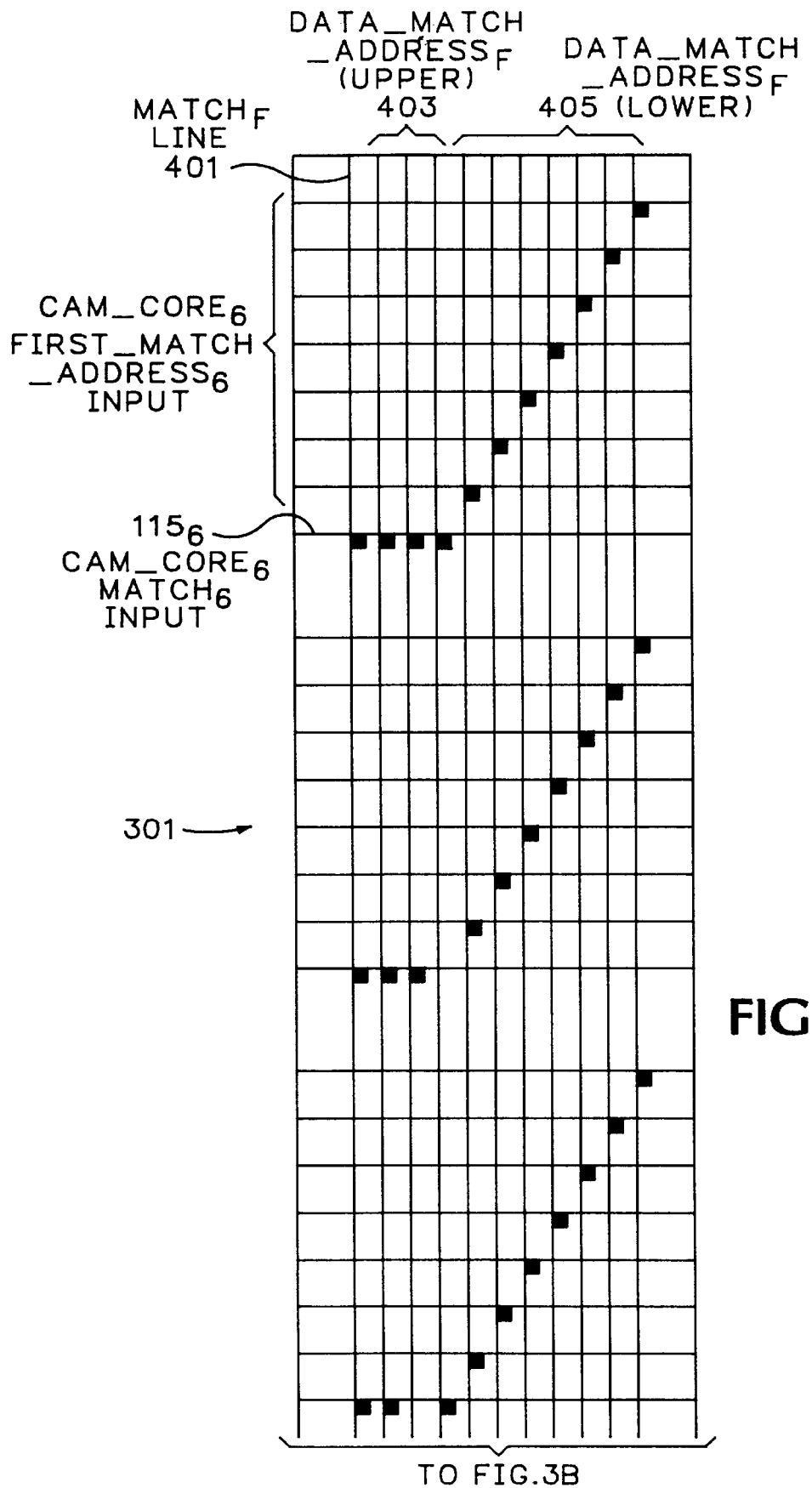
Figure 3B:
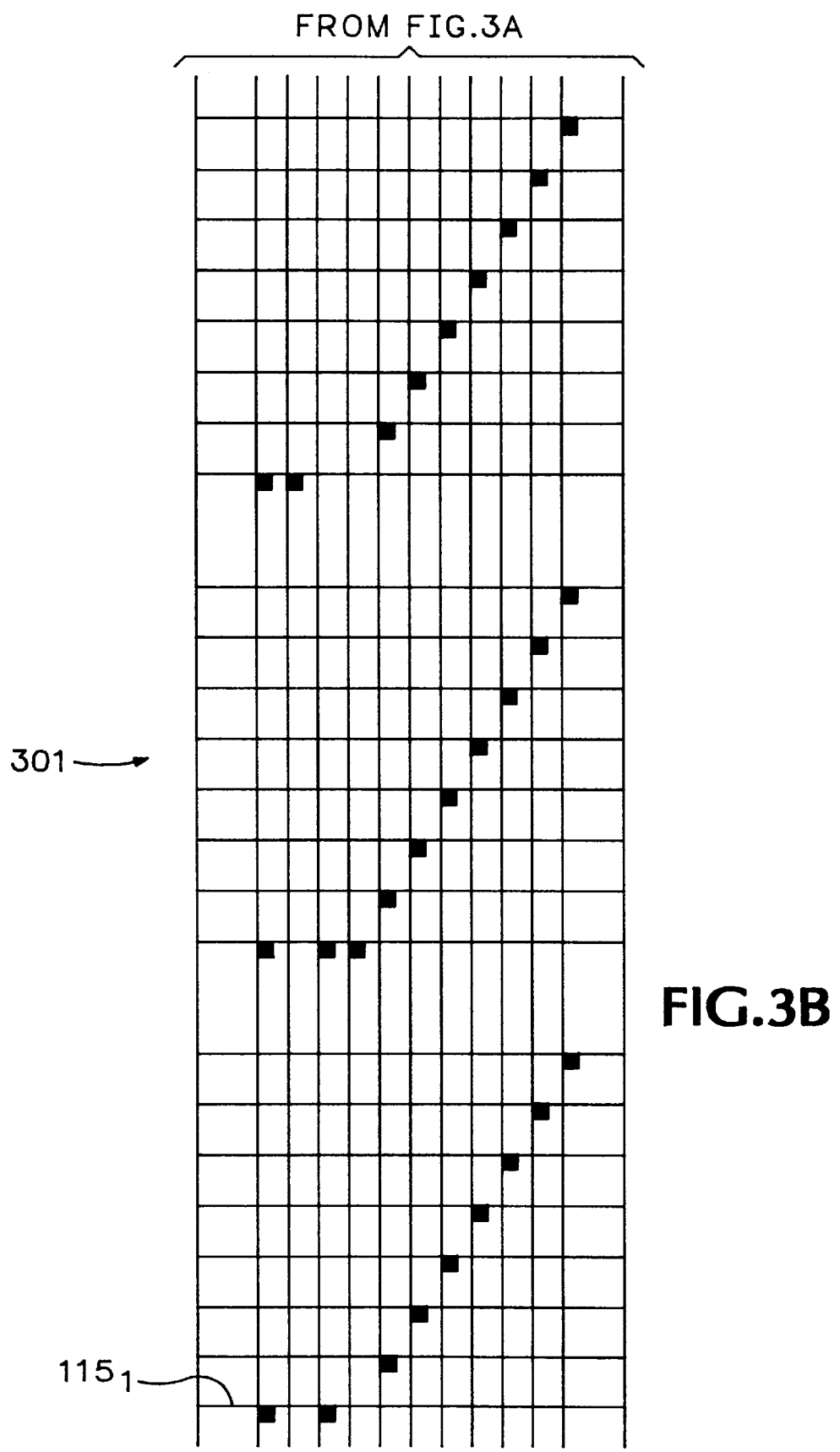
Figure 4A:
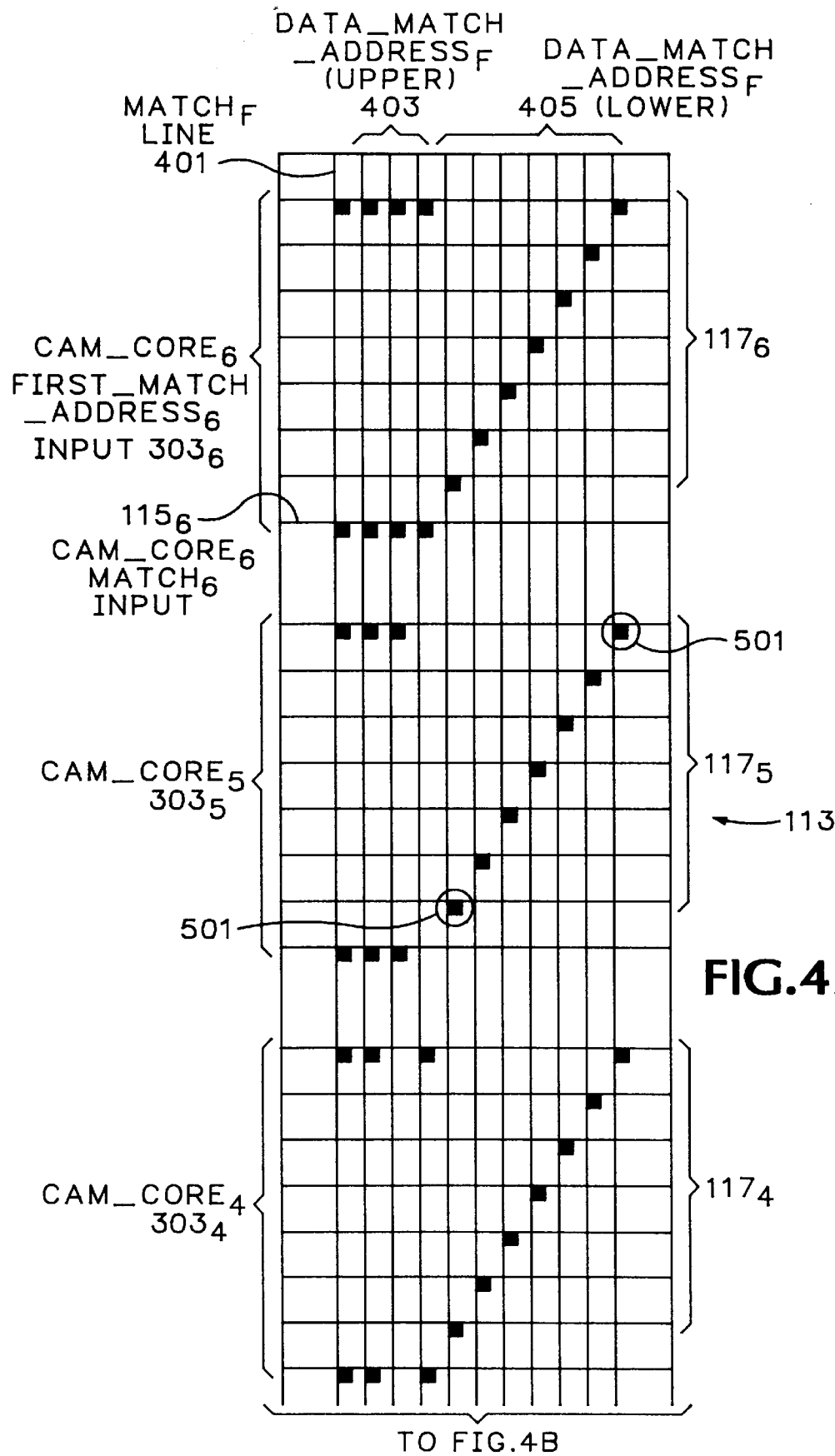
Figure 4B:
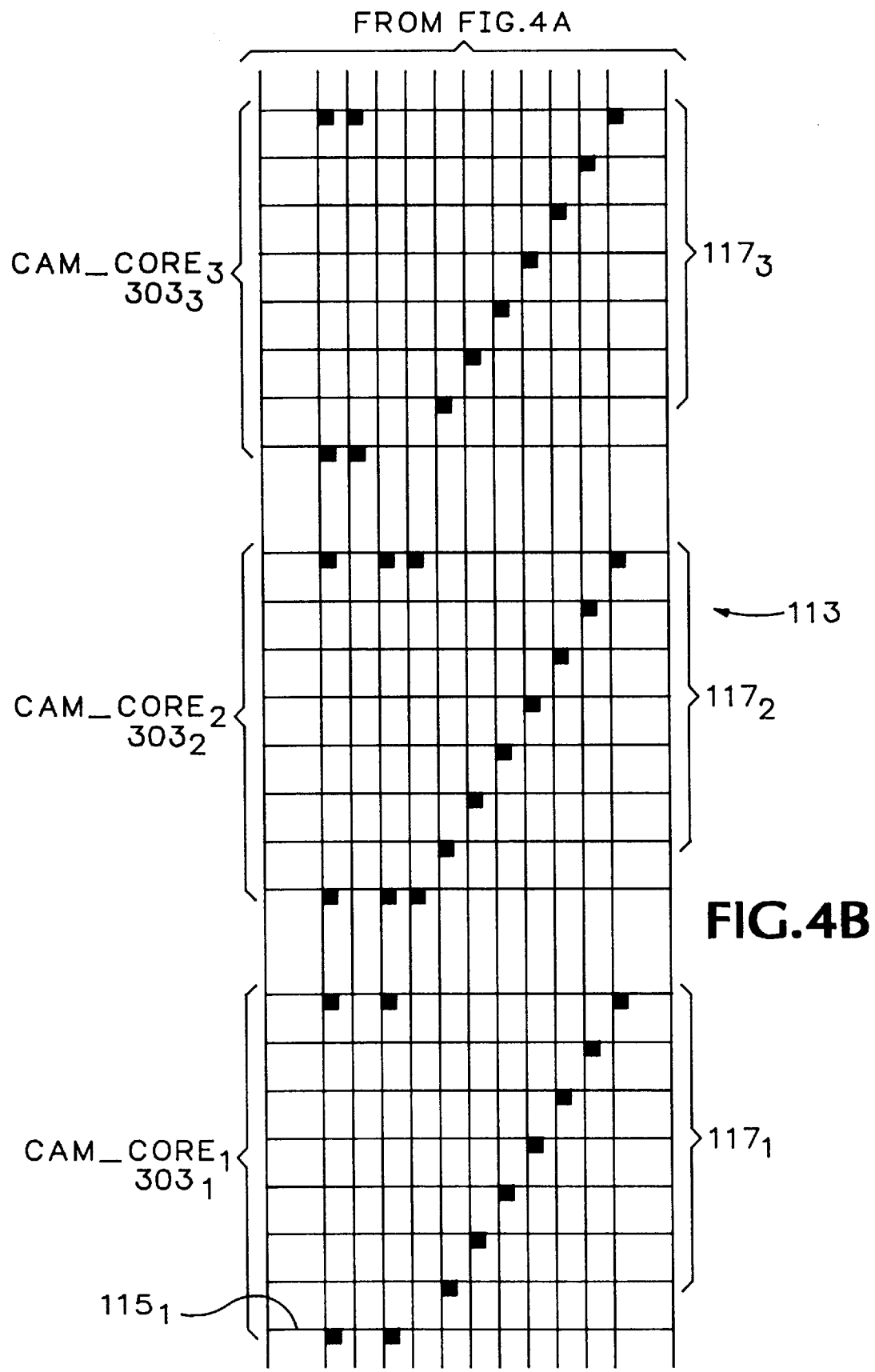

Turning now to FIG. 1, SEARCH_DATA on standard bus 101 is fed from the search engine (e.g., a central processing unit (not shown)) through a driver 103, comprising standard buffering hardware as would be known in the art to drive relatively the high capacitance of cam core cell architecture.

Each CAM_CORE $105_1$–$105_N$ comprises an array of standard transistor-based cell circuitry and search circuitry as would also be known to a person skilled in the art. Each cell of the array stores one bit. In accordance with the exemplary embodiment, a total CAM of 768_words by 19_bits is described. It is assumed for the exemplary embodiment that due to integrated circuit layout constraints, that N=6; that is, six CAM_CORES $105_1$–$105_6$ of 128_words by 19 bits each is provided.

The SEARCH_DATA is input through standard buses $107_1$–$107_N$ to interrogate each CAM_CORE $105_1$–$105_N$. While for implementation for certain algorithms more than one CAM_CORE $105_1$–$105_N$ could have a MATCH, it is assumed in this exemplary embodiment implementation that only one cell on one CAM_CORE $105_1$–$105_N$ contains the data set of interest. Thus, if any, there will be only one MATCH$_x$ signal and one corresponding FIRST_MATCH_ADDRESS$_x$.

In general it is known to precharge the CAM_CORE outputs; in this example, the outputs are precharged to all HIGH. Each CAM_CORE $105_1$–$105_N$ has an output bus $109_1$–$109_N$ with one line for each of the stored data words, viz. 128_words in the exemplary embodiment. If a mismatch occurs for any location, the output bit for that location is pulled to LOW to indicate a MISMATCH; thus, if an output stays HIGH, it indicates a MATCH.

If there is no match, all outputs go LOW. Thus, for each CAM_CORE $105_1$–$105_n$, one hundred and twenty eight outputs on respective buses $109_1$–$109_N$ tell whether a particular address in that cell array is a MATCH or a MISMATCH. The output signal derivation for each CAM_CORE output of the six device memory bank is accomplished using a memory FIRST_ENCODER $111_1$–$111_N$.

The one hundred and twenty eight outputs of the six CAM_COREs $105_1$–$105_6$ now need to be turned into a final match signal, MATCH_SIGNAL$_F$, and DATA_MATCH_ADDRESS$_F$ signal, preferably in one clock cycle, where DATA_MATCH_ADDRESS$_F$ is both the address of a particular CAM_CORE $105_x$ and its cell array address, FIRST_MATCH_ADDRESS$_x$. Assuming again only one MATCH designation for one CORE_CORE $105_1$–$105_N$ of the memory bank, CAM_CORE$_1$ $105_1$ through CAM_CORE$_N$ $105_N$, a MATCH$_F$ signal and an appropriate DATA_MATCH_ADDRESS$_F$ is derived using FINAL_ENCODER 113.

Turning now to FIGS. 2A and 2B, a standard CAM encoder 201, FIG. 2A, is shown. Such an encoder 201 is used in a CAM system such as shown in the assignee's U.S. Pat. No. 5,373,290 (Lempel et al.) as element 194, FIG. 5, explained beginning in column 12, line 28 et seq., incorporated herein by reference in its entirety. In the encoder 201, a MATCH line 203 has a pull down transistor 205, configured as in FIG. 2C, one for each of the one hundred and twenty eight data words in each CAM_CORE $105_1$–$105_N$. Likewise, one hundred and twenty eight CORE_MATCH lines $207_{0000000}$ (location zero) through $207_{1111111}$ (location 127) are multiplexed to the MATCH line 203, from a least significant bit ("LSB") MATCH_ADDRESS line $209_1$ through a most significant bit ("MSB) MATCH_ADDRESS line $209_7$, in essence a multiplex wired OR configuration [note: as will be described hereinafter, seven bits will also form the lower address bits of a ten bit address from the FINAL_ENCODER 113, FIG. 1]. Thus, the MATCH line 203 has one hundred and twenty eight pull down transistors 205 (counted vertically in FIG. 2A), but each of the MATCH_ADDRESS lines $20_1$–$209_7$ has only sixty four pull down transistors.

Comparing this embodiment of the standard CAM encoder 201 in FIG. 2A to the FIRST_ENCODER 201 in accordance with the present invention as shown in FIG. 2B, the difference lies in that on MATCH line 203, pull down transistors 205 are provided only for one half of CORE_MATCH lines $207_{0000000}$ (location zero) through $207_{1111110}$ (location 126). For locations having no MATCH line 203 pull down transistors 205, a designated pull down transistor of the MATCH_ADDRESS lines $209_1$–$209_7$ are used to serve double duty, that is, also indicating a match condition when switched.

For example, as shown where every other MATCH line 203 has a pull down transistor 205, if the DATA of interest of the SEARCH_DATA is at location 0000011, a location having no MATCH line 203 pull down transistor 205 but using bit_0 to do the double duty, since only one location of the CAM_CORE is ever a match, no conflicts will occur. That is, if the CAM_CORE has set the MATCH_ADDRESS at location 0000011, bit_0 has change state, indicating a MATCH. As another example, if the most significant MATCH_ADDRESS bit is used for the double duty, only the top sixty-four MATCH lines 203 require pull down transistors 205. Thus, use of one of the MATCH_ADDRESS bits as also indicating a MATCH when a true match has occurred in this manner reduces the number of pull down transistors on the MATCH line 203 to sixty-four. As a result, the MATCH line 203 will be as fast as the MATCH_ADDRESS lines 209. In a commercial implementation having a search access time of approximately 6 nanoseconds, an improvement of approximately 0.5 nanosecond has been found to be achieved.

Recall that the present exemplary embodiment as shown in FIG. 1 uses a bank of six CAM_CORES $105_{1-6}$, each with its own FIRST_ENCODER $111_{1-6}$. Now each of the output signals MATCH$_{1-6}$ on each FIRST_ENCODER_MATCH output bus $115_{1-6}$ and its appurtenant FIRST_MATCH_ADDRESS output bus $117_{1-6}$ needs to be encoded in order to obtain both a final MATCH$_F$ signal back to the CPU, indicating the data of interest has been found, and a DATA_MATCH_ADDRESS$_F$ specifying both the FIRST_MATCH_ADDRESS on bus $117_x$, where x=the CAM_CORE$_{0-127}$ location which generated a MATCH signal, and a designation of which of the six CAM_CORES $105_{1-6}$ generated a MATCH signal. This function is accomplished in the FINAL_ENCODER 113 by adding three upper address bits to the seven FIRST_MATCH_ADDRESS bits for the CAM_CORE 105 location where the full data of interest resides.

Turning to FIGS. 3A–3B and 4A–4B, a FINAL_ENCODER 113 for accomplishing this task is provided.

FIG. 3A again refers to an embodiment as shown in assignee's U.S. Pat. No. 5,373,290 as part of element 194, FIG. 5. In element 194, a final_encoder 301 for an array of six cam_cores has six sections, one designated for each cam_core of the array. As stated earlier, each FIRST_ENCODER $111_{1-N}$, FIG. 1, has an output line $115_{1-N}$ for a MATCH$_{1-N}$ signal and an output bus $117_{1-N}$ for a FIRST_MATCH_ADDRESS$_{1-N}$. Looking to both FIGS. 3A–3B and 4A–4B for comparison, and focusing on the section of FINAL_ENCODER 113, FIG. 1, for CAM_CORE$_6$ as an example of each section, the MATCH$_6$ signal on line $115_6$ provides an appropriate HIGH or LOW state signal to each respective FINAL_ENCODER 113 input subsection, CAM_CORE$_{1-N}$, $303_{1-N}$ Each FIRST_MATCH_ADDRESS 7-bit bus $117_{1-N}$ is likewise input to each FINAL_ENCODER 113 input subsection, CAM_CORE$_{1-N}$. That is to say, each CAM_CORE$_x$ has its respective FIRST_ENCODER $111_x$ output connected to a respective subsection of the FINAL_ENCODER 113 which will in turn provide the actual MATCH$_F$ signal and DATA_MATCH_ADDRESS$_F$ for the data of interest based on the SEARCH_DATA input.

Figure 5A:
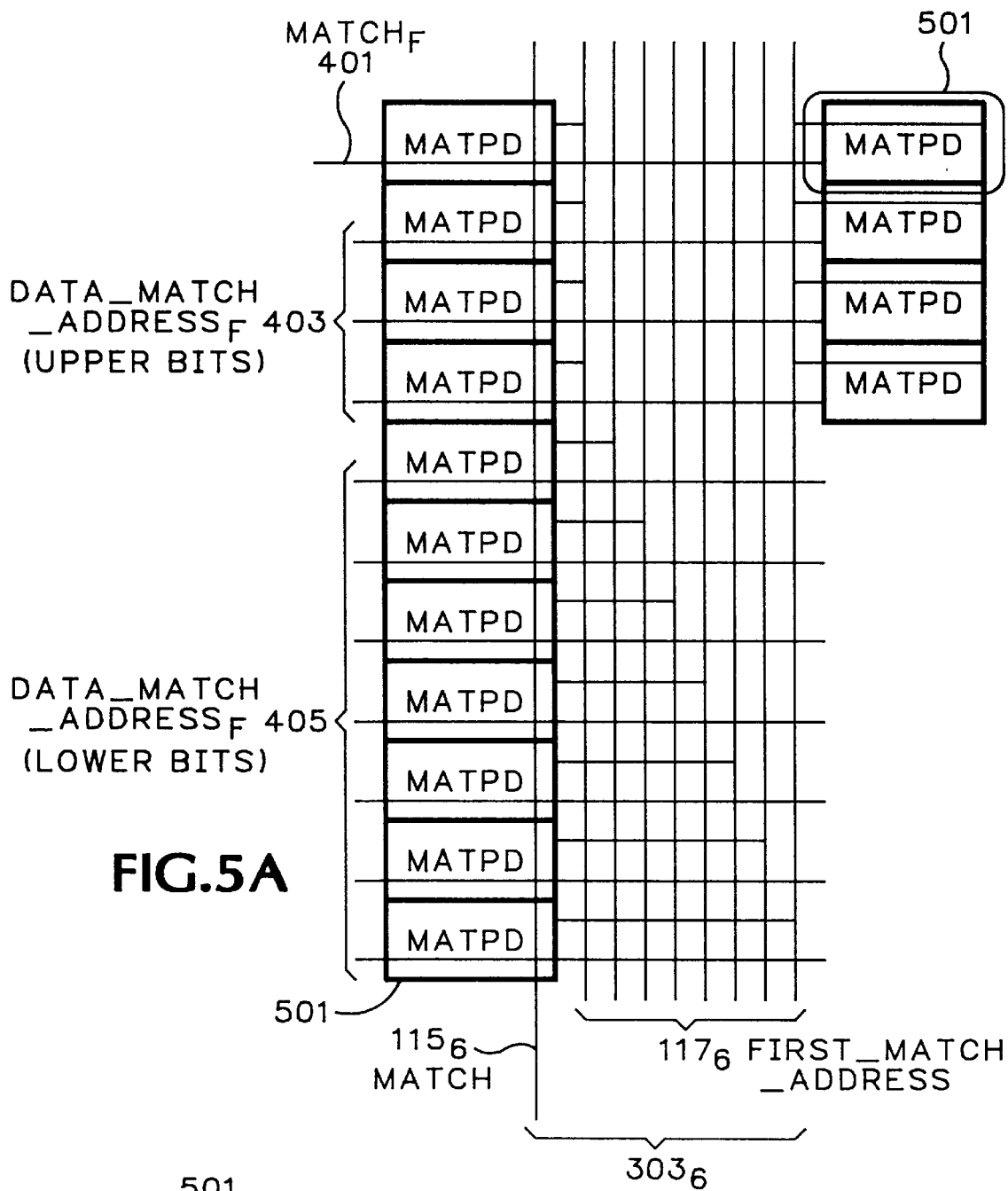
FIG. 5A is a detailed schematic of one final_encoder subsection for a CAM_CORES$_x$, as shown in FIG. 4B.
Figure 5B:
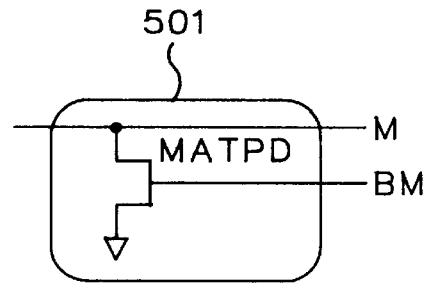
FIG. 5B is a detail of FIG. 5A.

Looking also to FIGS. 5A and 5B, detail for FINAL_ENCODER 113 subsection CAM_CORE$_6$ $303_6$ is depicted. The FINAL_ENCODER 113 is multiplexed with the inputs 115, 117 from the FIRST_ENCODER$_x$. Match signal pull down transistors 501 are provided in a manner such that when a MATCH$_6$ and FIRST_MATCH_ADDRESS$_6$ is received from a FIRST_ENCODER$_6$, the FINAL_ENCODER input subsection CAM_CORE$_6$ will provide both a MATCH$_F$ signal on FINAL_MATCH_LINE 401 and an expanded, 10-bit address for the data, DATA_MATCH_ADDRESS$_F$. In the example, the DATA_MATCH_ADDRESS designates the CAM_CORE$_6$ in its added upper three bits on DATA_MATCH_ADDRESS$_F$ upper bit lines $403_{1-3}$, and pass through the FIRST_MATCH_ADDRESS$_6$ on DATA_MATCH_ADDRESS$_F$ lower bit lines $405_{1-7}$ (with reversal of all signal levels, HIGH to LOW and LOW to HIGH if necessary to use standard logic where HIGH=1).

Returning to FIGS. 3A–3B and 4A–4B, each CAM_CORE, can be compared and it can be seen that the removal of half of the pull down transistors 205 on FIRST_ENCODER_MATCH lines 207 in FIG. 2B for providing the MATCH$_x$ signal has been added back in the FINAL_ENCODER 113 on MATCH$_E$ lines 401. However, it has been found that this arrangement in the critical path in the present invention as shown in FIGS. 2B, 4A–4B, and 5A–5B provides an improvement of in reducing the cycle time approximate ten percent over the arrangement of FIGS. 2A, 3A–3B in a synergistic manner.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application to thereby enable others skilled in the art to understand the invention for various embodiments and with various modifications as are suited to the particular use contemplated. It is intended that the scope of the invention be defined by the claims appended hereto and their equivalents.

What is claimed is:

1. An encoder apparatus for a CAM, having a cell array of addressable cell means for storage of data bits therein, said apparatus, comprising:

first encoding means for receiving CAM cell array outputs, the first encoding means including:
 a MATCH signal line connected to each cell,
 a plurality of MATCH ADDRESS signal lines connected to the MATCH signal line, and wherein
 the MATCH signal line and each of the MATCH ADDRESS signal lines have an identical number of substantially identical switching means for indicating a change in digital state value on said MATCH signal and MATCH ADDRESS signal lines, respectively, wherein said MATCH signal line includes one of said switching means for one-half of the cells in the cell array and wherein a predetermined one of said switching means on said MATCH ADDRESS signal lines designates both a binary digit of the MATCH ADDRESS signal and a MATCH signal on lines for MATCH signals not having a MATCH signal line switching means; and first output bus means for transmitting MATCH signals and MATCH ADDRESS signals.

2. The apparatus as set forth in claim 1, further comprising:

one MATCH ADDRESS signal line for each bit of a cell array word designating an address in the cell array.

3. The apparatus as set forth in claim 2, further comprising:

the predetermined one of said switching means on said MATCH ADDRESS signal lines is to a same designated line for each CAM cell address.

4. The apparatus as set forth in claim 1, in a system having a bank of said CAM cell arrays, the apparatus further comprising:

a plurality of first encoding means, one for each of said CAM cell arrays;

connected to said first output bus means, second encoding means for encoding a MATCH signal and MATCH ADDRESS signal indication from one of said CAM cell arrays with a signal indicative of the CAM cell array providing the MATCH signal.

5. The apparatus as set forth in claim 4, the second means for encoding further comprising:

a MATCH$_F$ line having a pair of switching means, one for each of the first output bus MATCH signal lines and one for each of the lines for each array wherein a predetermined one of said switching means on said MATCH ADDRESS signal lines.

6. The apparatus as set forth in claim 4, the second encoding means further comprising:

means for adding bits to said MATCH ADDRESS signal indicative of the CAM cell array in the bank providing the MATCH signal and MATCH ADDRESS signal and for outputting a MATCH ADDRESS$_F$ signal designating both which said array in the bank provided the MATCH signal and an address within said array.

7. A method for encoding MATCH signal and MATCH ADDRESS signal generation for a content addressable memory cell array, having a plurality of addressable data storage locations, the method comprising the steps of:

generating a single-bit MATCH signal for one-half of the data locations in said array;

generating a multi-bit MATCH ADDRESS signal for every data location in said array; and using a bit signal from a generated multi-bit MATCH ADDRESS signal as a substitute MATCH signal for every data location not generating a single-bit MATCH signal.

8. The method as set forth in claim 7, further comprising:

using a same bit signal location in said multi-bit MATCH ADDRESS signal as the substitute MATCH signal for every data location not generating a single-bit MATCH signal.

9. An encoder apparatus for MATCH signal and MATCH ADDRESS signal generation for a bank of a plurality of content addressable memory (CAM) cell arrays, each of said CAM cell arrays storing data having a plurality of bits, one bit in each cell, constituting bit words of said stored data, and each of said bit words are stored in a unique addressable location designated by some of said bits in each of said bit words, said apparatus comprising:

a plurality of first encoding means for encoding a MATCH signal and first MATCH ADDRESS signal for each of said CAM cell arrays, each of said first encoding means having a first means for transmitting a MATCH signal for each of one-half of the addressable locations in an array, and a second means for transmitting a first MATCH ADDRESS signal for every one of the addressable locations wherein at least one predetermined bit of the first MATCH ADDRESS signal is also a substitute MATCH signal for addressable locations other than said one-half of the addressable locations; and a second encoding means for receiving a MATCH signal and a first MATCH ADDRESS signal from each of said plurality of first encoding means and for adding to said first MATCH ADDRESS signal for the CAM cell array transmitting a first MATCH ADDRESS a second MATCH ADDRESS signal indicative of which specific CAM cell array of said bank generated a MATCH signal or first MATCH ADDRESS signal having said at least one bit set as a substitute MATCH signal.

10. The apparatus as set forth in claim 9, the first means for transmitting further comprising:

one MATCH signal line connected to all of the addressable locations.

11. The apparatus as set forth in claim 10, the second means for transmitting further comprising:

a plurality of MATCH ADDRESS signal lines, one for each bit of a CAM cell array word, the plurality designating an address for the CAM cell.

12. The apparatus as set forth in claim 11, further comprising:

at least one switching means on each MATCH ADDRESS line for pulling a line up to a HIGH signal or pulling a line down to a LOW signal.

13. The apparatus as set forth in claim 12, further comprising:

a predetermined one of said MATCH ADDRESS signal lines is the same designated line for each addressable location to provide the substitute MATCH signal.

14. The apparatus as set forth in claim 13, further comprising:

a MATCH$_F$ line having a pair of switching means, one for a MATCH signal line and one for the predetermined one of said MATCH ADDRESS signal lines, for designating both a binary digit of the MATCH ADDRESS signal and a substitute MATCH signal on MATCH signal lines not having a MATCH signal line switching means.

15. The apparatus as set forth in claim 14, the second encoding means further comprising:

means for adding bits to said MATCH ADDRESS signal indicative of the CAM cell array providing either the MATCH signal and MATCH ADDRESS signal or the MATCH ADDRESS signal including a substitute MATCH signal and for outputting a MATCH ADDRESS$_F$ signal designating both the array and an addressable location within the array for which a MATCH signal or substitute MATCH signal was transmitted.

16. A method for encoding MATCH signal and MATCH ADDRESS signal generation for a bank of plural content addressable memory (CAM) cores, the method comprising the steps of:

encoding an actual MATCH signal for one-half of addressable memory locations of a CAM core;

encoding a MATCH ADDRESS signal for each addressable memory location of a CAM core;

generating a substitute MATCH signal by using a part of a MATCH ADDRESS signal as the substitute MATCH signal for addressable locations of said CAM core for which an actual MATCH signal is not encoded; and encoding a MATCH signal or substitute MATCH signal and an associated MATCH ADDRESS signal by adding a signal indicative of which CAM core of said bank said MATCH ADDRESS is located.

17. The method as set forth in claim 16, the step of encoding a substitute MATCH signal further comprising:

using a predetermined signal bit of each MATCH ADDRESS signal for designating an address for the CAM cell as the substitute MATCH signal.

* * * * *

UNITED STATES PATENT AND TRADEMARK OFFICE
CERTIFICATE OF CORRECTION

PATENT NO.   : 5,828,324
DATED        : October 27, 1998
INVENTOR(S)  : Airell R. Clark, II It is certified that error appears in the above-identified patent and that said Letters Patent is hereby corrected as shown below:

Column 4,
Line 41, delete "$20_1$-$209_7$" and insert therefor -- $209_1$ - $209_7$ --

Column 5,
Line 31, delete "$^{115}_{1-N}$" and insert therefor -- $115_{1-N}$ --
Lines 65-66, delete "CAM_CORE," and insert therefor -- CAM_CORE $_x$ --

Column 6,
Line 4, delete "$MATCH_E$" and insert therefor -- $MATCH_F$ --

Signed and Sealed this

Eighth Day of October, 2002

Attest:

Attesting Officer

JAMES E. ROGAN
*Director of the United States Patent and Trademark Office*